United States Patent
Lazarov et al.

(10) Patent No.: US 8,920,026 B2
(45) Date of Patent: Dec. 30, 2014

(54) ACCURATE CURRENT SENSING WITH HEAT TRANSFER CORRECTION

(75) Inventors: Kalin V. Lazarov, Colorado Springs, CO (US); Matthew J. Maloney, Colorado Springs, CO (US); Christopher Pollard, Colorado Springs, CO (US); Edson W. Porter, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 368 days.

(21) Appl. No.: 13/035,884

(22) Filed: Feb. 25, 2011

(65) Prior Publication Data
US 2012/0218022 A1    Aug. 30, 2012

(51) Int. Cl.
G01K 17/00 (2006.01)
G01R 19/00 (2006.01)
G01R 1/20 (2006.01)

(52) U.S. Cl.
CPC ............ *G01R 19/0092* (2013.01); *G01R 19/00* (2013.01); *G01R 1/203* (2013.01)
USPC ............. 374/170; 374/171; 374/120; 374/29; 374/183; 374/1; 374/141; 702/130; 702/99

(58) Field of Classification Search
CPC .............. G01J 2005/068; G01K 1/20
USPC ......... 374/163, 170–172, 183–185, 1, 4, 109, 374/32, 43, 45, 57, 141, 5, 29–20, 137, 165, 374/39; 702/99, 130, 132–136; 219/200, 219/201
See application file for complete search history.

(56) References Cited

U.S. PATENT DOCUMENTS

| | | | | |
|---|---|---|---|---|
| 3,610,931 A | * | 10/1971 | Woolfson | 250/338.1 |
| 3,890,841 A | * | 6/1975 | Brixy | 374/175 |
| 4,215,336 A | * | 7/1980 | Smith | 340/870.17 |
| 5,603,570 A | * | 2/1997 | Shimizu | 374/100 |
| 5,660,052 A | * | 8/1997 | Kenyon et al. | 62/228.3 |
| 5,709,470 A | * | 1/1998 | Finley | 374/16 |
| 5,803,357 A | * | 9/1998 | Lakin | 236/78 B |
| 6,015,234 A | * | 1/2000 | Gourrier et al. | 374/164 |
| 6,404,169 B1 | * | 6/2002 | Wang | 320/150 |
| 6,687,105 B2 | | 2/2004 | Duduman et al. | |
| 7,262,628 B2 | | 8/2007 | Southwell et al. | |

(Continued)

OTHER PUBLICATIONS

"Input Power Monitor with Digital Interface," International Rectifier, IR3725 Data Sheet, pp. 1-19.

*Primary Examiner* — Gail Kaplan Verbitsky
(74) *Attorney, Agent, or Firm* — Patent Law Group LLP; Brian D. Ogonowsky

(57) ABSTRACT

In one embodiment, a current sensing circuit corrects for the transient and steady state temperature measurement errors due to physical separation between a resistive sense element and a temperature sensor. The sense element has a temperature coefficient of resistance. The voltage across the sense element and a temperature signal from the temperature sensor are received by processing circuitry. The processing circuitry determines a power dissipated by the sense element, which may be instantaneous or average power, and determines an increased temperature of the sense element. The resistance of the sense element is changed by the increased temperature, and this derived resistance Rs is used to calculate the current through the sense element using the equation I=V/R or other related equation. The process is iterative to continuously improve accuracy and update the current.

14 Claims, 2 Drawing Sheets

(56) References Cited

U.S. PATENT DOCUMENTS

| | | | |
|---|---|---|---|
| 7,407,323 B2* | 8/2008 | Hutcherson | 374/1 |
| 7,607,823 B2* | 10/2009 | Kent | 374/4 |
| 7,653,503 B2* | 1/2010 | Mangalam et al. | 702/100 |
| 7,741,983 B1 | 6/2010 | Lakshmikanthan et al. | |
| 8,314,623 B2* | 11/2012 | Nelson et al. | 324/721 |
| 8,485,725 B2* | 7/2013 | Nelson et al. | 374/185 |
| 8,602,642 B2* | 12/2013 | Klewer | 374/45 |
| 2010/0020842 A1* | 1/2010 | Riddle et al. | 374/1 |
| 2013/0070805 A1* | 3/2013 | Coln et al. | 374/1 |

* cited by examiner

ACCURATE CURRENT SENSING WITH HEAT TRANSFER CORRECTION

FIELD OF THE INVENTION

This invention relates to a current sense circuit using the detected voltage drop across a sense resistor to calculate the current through the resistor and, in particular, to a technique that compensates for fluctuations in resistivity of the sense resistor with temperature.

BACKGROUND

It is well known to detect current by measuring the voltage across a low resistivity sense resistor, then calculating current by dividing the voltage by the nominal resistance. This is frequently done in switching power supplies where switches are controlled based on a current through a sense resistor crossing a threshold level to achieve a target output voltage.

Generally, the resistance of all sense resistors is somewhat sensitive to temperature (i.e., the resistor has a temperature coefficient of resistance).

In switching power supplies, an inductor is used in the output filter. The copper winding may be used as the sense resistor. Thus no additional voltage drop is incurred, and no additional real estate is needed for the sense resistor. However, the resistance of the inductor winding is relatively sensitive to temperature fluctuations. Therefore, the sensed current through the winding will not be accurate as the temperature varies from a reference temperature used to set the resistance value of the winding.

It is known to provide a temperature sensor, such as a pn junction device, proximate to the sense resistor in an attempt to determine the actual temperature of the sense resistor and correct for any deviation in resistance due to the actual temperature differing from the reference temperature. The actual temperature of the sense resistor may fluctuate due to the changing power dissipated by the sense resistor. Since the sense resistor itself is generating heat, and the temperature sensor is separated from the sense resistor, the temperature sensor does not accurately sense the actual temperature of the sense resistor. The temperature of the sense resistor may fluctuate due to changes in power, and the medium between the sense resistor and the temperature sensor cannot quickly conduct the resistor temperature to the temperature sensor due to the thermal time constant of the medium. The medium may be a printed circuit board, silicon, a ceramic substrate, etc.

What is needed is a more accurate technique for estimating the actual temperature of the sense resistor so that the actual resistance of the sense resistor can be better estimated when calculating the current through the sense resistor.

SUMMARY

The actual resistance Rs of a sense resistor equals:

$$Rs=Ro(1+\alpha(Ts-Tref+Terr)) \quad \text{eq. 1}$$

$$Terr=\theta P(1-e^{-t/\tau}), \quad \text{eq. 2}$$

where Ro equals the resistance of the sense resistor at a known reference temperature Tref, where $\alpha$ is the temperature coefficient of the sense resistor (for copper winding, $\alpha$ is 3900 ppm/° C.), where Ts is temperature of the sense resistor measured by a temperature sensor device proximate to the sense resistor, where Terr is the error between the actual sense resistor temperature and the temperature sensed by the temperature sensor (the sense resistor is assumed to have a temperature that is higher than the temperature sensed by the temperature sensor), where $\theta$ is the thermal resistance of the medium that separates the sense resistor and the temperature sensor, where P is the instantaneous or average power dissipated by the sense resistor, and where $\tau$ is the thermal time constant of the medium between the sense resistor and the temperature sensor. The actual temperature Tr of the sense resistor is Ts+Terr=Tr.

The current sensing circuit comprises a voltage detector detecting the actual voltage Vs across the sense resistor, a temperature sensor circuit generating a sensed temperature Ts signal, and feedback circuitry that performs certain algorithms using the Vs and Ts measurements. In one embodiment, the current sensing circuit derives the actual resistance Rs of the sense resistor as follows. The instantaneous or time-average power P dissipated by the sense resistor is calculated to be P=Is*Vs, where Is is the derived current through the sense resistor, and Vs is the actual voltage sensed across the resistor. In the iterative process used in one embodiment of the invention, the initial estimate of the resistance used to calculate the current can be Rs=Ro (1+$\alpha$(Ts−Tref)). Whether the power P is the instantaneous power or average power (over a certain period) depends on the fluctuation frequency of current. For a DC circuit, P may be instantaneous or average. For a circuit where the frequency is above a threshold, the power should be the average, or root-mean-square (RMS), power over a certain time period. The power P signal is then applied to the following equation to derive the actual temperature Tr of the sense resistor: Tr=Ts+$\theta$P(1−$e^{-t/\tau}$). The derived actual temperature Tr is then applied to the following equation to generate the actual resistance Rs of the sense resistor: Rs=Ro (1+$\alpha$(Tr−Tref)). The value Rs is then applied to the following equation to derive the sense current Is=Vs/Rs. In the feedback circuit, the derived Is value is iteratively applied to the power P calculation algorithm to increase the accuracy of the instantaneous or average power P value and update the power P value based on the actual sensed voltage Vs. This continuous feedback and sensing provides an accurate determination of the current Is through the sense resistor based on the derived actual temperature and actual resistance value of the sense resistor. Several iterations are sufficient to significantly increase the current measurement accuracy compared to the accuracy achieved by prior art techniques.

In one embodiment, the circuit is initially calibrated at a single temperature using only two current measurements, where known currents are conducted through the sense resistor. All values other than Rs, Tr, Vs, Is, and P are values that can be obtained during the initial calibration or obtained by the manufacturer of the components. Once the steady state parameters have been calculated, residual transient errors in measured current can be used to calculate the time dependent parameter T. The present technique calibrates and corrects for thermal gradients in the material between the sense resistor and the temperature sensor.

The preferred embodiment of the present innovation corrects for the transient and steady state temperature measurement errors due to physical separation between a resistive sense element and the temperature sensor, although even correcting for steady state errors using the disclosed techniques is an improvement over the known prior art.

The sense resistor can be any resistive component such as a dedicated sense resistor or an existing component in a larger circuit, such as an inductive winding in a switching power supply.

Other embodiments are described.

BRIEF DESCRIPTION OF THE DRAWINGS

Elements that are the same or equivalent are labeled with the same numeral.

DETAILED DESCRIPTION

The present invention is applicable to detecting the current through any sense resistor, assumed to have a temperature coefficient of resistance, where the temperature of the sense resistor is taken into account when calculating the current.

Figure 1:
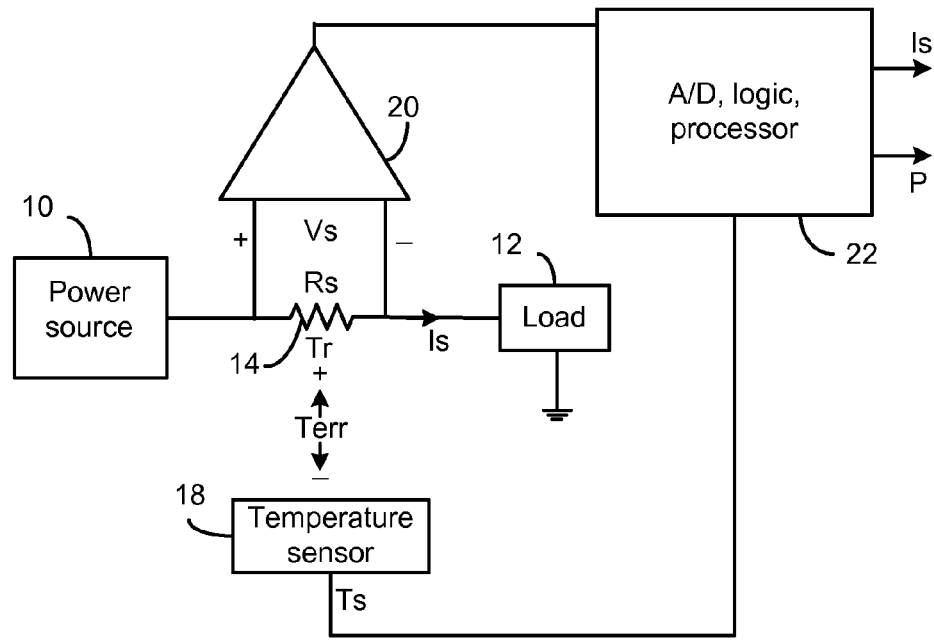
FIG. 1 illustrates a current sensing circuit in accordance with one embodiment of the invention.

FIG. 1 illustrates a current sensing circuit in accordance with one embodiment of the invention. The power source 10 represents any power source, such as a switching power supply that controls switching transistors to apply pulses of current to generate a regulated voltage for a load 12. The load 12 may include inductors, capacitors, resistors, transistors, and any other components. In the example of a switching power supply, the load 12 may include the output filter, rectifier, and feedback circuitry to cause the power supply to generate a target DC voltage. The sense resistor 14 may be located at other positions in the circuit.

The power source 10 generates a current conducted by the sense resistor 14. The sense resistor 14 may be any type of resistor, such as a metal, a semiconductor material, an inductor winding, carbon, or any other material. The resistance of the material is assumed to have a temperature coefficient α, whereby its resistance changes with temperature (ΔR/Ro=αΔT). In the example of a metal being the resistor, such as an inductor winding or a trace on a PCB, the resistance increases with temperature (a positive temperature coefficient). For other resistive materials, there may be a negative temperature coefficient. If the sense resistor 14 is an added component, the resistance is selected to be very low. The sense resistor 14 may also be an existing component in a circuit, such as the inductor winding in a switching power supply.

A temperature sensor 18 is located proximate to the sense resistor 14 in an attempt to measure the actual temperature of the sense resistor 14. The temperature sensor 18, in actuality, detects the temperature of the environment of the sense resistor 14. The temperature sensor 18 may be a pn junction of a diode or transistor whose conduction characteristics vary in a known manner with temperature. Such temperature sensors 18 and their associated circuitry are well known. The temperature sensor 18 may be located within 1 cm of the sense resistor 14, such as on the same chip, substrate, or circuit board.

The current through the sense resistor 14 is Is. The voltage across the sense resistor 14 is Vs and may be measured by a differential amplifier 20 connected across the resistor 14. The estimated actual resistance of the sense resistor 14 at the current-detecting temperature is Rs. Since the voltage Vs can be directly measured, the current Is can be calculate by the equation Is=Vs/Rs.

However, the resistance Rs at the time of the current detection cannot be directly measured, and the temperature Tr of the sense resistor 14 varies somewhat with its temperature. The actual temperature Tr of the sense resistor may be estimated by the ambient temperature (a reference temperature Tref) plus the increase in the resistor's temperature as a result of the instantaneous or average power P dissipated by the resistor 14. Since the temperature of the sense resistor does not vary instantaneously with power, but has a temperature time constant, whether the power P is the instantaneous power or average power (over a certain period) depends on the fluctuation frequency of current. For a DC circuit, P may be instantaneous or average. For a circuit where the frequency is above a threshold, the dissipated power should be the average, or root-mean-square (RMS), power over a certain time period. The time period depends on the actual resistor used, since different resistors have different thermal masses. Power P is determined by the equation P=Is*Vs. The power can also be calculated, when appropriate, by the equation $P=V_{RMS}^2/Rs$ or $P=I_{RMS}^2*Rs$.

The temperature sensor 18 can be located proximate to the resistor 14, but the temperature sensor 18 cannot accurately detect the increase in resistor temperature due to an increase power dissipated by the resistor 14. The thermally conductive medium (e.g., silicon, ceramic, PCB, etc.) between the resistor 14 and the temperature sensor 18 does not instantly conduct the resistor temperature to the temperature sensor 18. There is a thermal time constant τ associated with the medium, causing a time-dependent thermal gradient across the medium. The heat of the resistor 14 is transferred through the medium in accordance with the following transfer equation:

$$Terr=\theta P(1-e^{-t/\tau}),$$

where Terr (temperature error) is the difference between the actual sense resistor 14 temperature and the temperature detected by the temperature sensor 18, θ is the thermal resistance of the medium that separates the sense resistor 14 and the temperature sensor 18, P is the instantaneous or average power dissipated by the sense resistor 14, τ is the thermal time constant of the medium between the sense resistor 14 and the temperature sensor 18, and t is the elapsed time between an increase in heat generated by the resistor 14 and the measurement of temperature by the "remote" temperature sensor 18. The actual temperature Tr of the sense resistor is Tr=Ts+Terr, where Ts is the temperature sensed by the temperature sensor and Terr is the difference between the actual sense resistor temperature Tr and the temperature Ts detected by the temperature sensor 18 across the medium.

The circuit block 22 represents all processing circuitry that processes the temperature sensor 18 signal and Vs signal to derive the actual current Is through the sense resistor 14 by deriving the actual resistance of the sense resistor 14 at the time of the detection and performing the following equation: Is=Vs/Rs. The processing circuit may also calculate the RMS values of the Vs and Is signals for purposes of calculating the dissipated power P if the average power is used in the equations. The block 22 may contain analog-to-digital converters for converting the analog Vs and temperature sensor 18 signals into digital signals for processing by logic circuitry (e.g., firmware, look-up tables, etc.) or a microprocessor running a stored program. The hardware circuitry within the block 22 may be conventional but programmed to carry out the functions described below. One skilled in the art may easily program processing or logic circuitry to carry out the disclosed functions.

Figure 2:
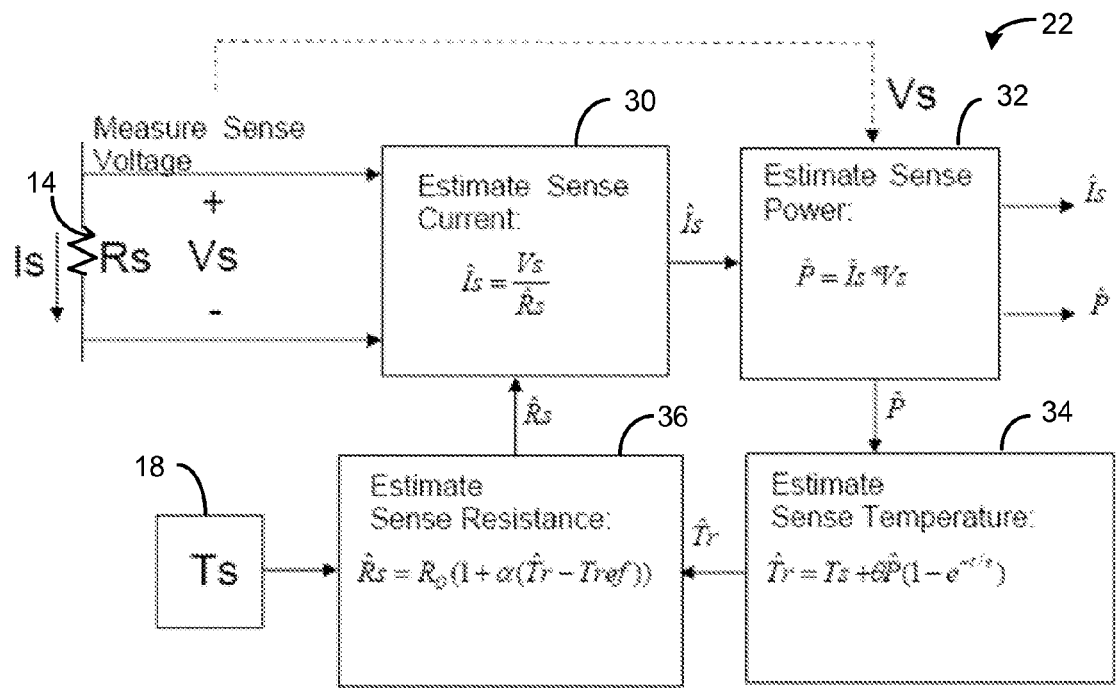
FIG. 2 illustrates the processing performed by logic or other processing circuitry when deriving the current through a sense resistor.

FIG. 2 illustrates the processing performed by the block 22 in deriving the current Is through the sense resistor 14. The process is a fast iterative and cyclical process that continually updates the values of Is, P, Tr, and Rs based on instantaneous readings of Vs and Ts and based on any averaging of the Vs and derived Is values.

In the function block 30, the current through the sense resistor 14 is estimated as Is=Vs/Rs. In the initial iterative cycle, Rs may be the known resistance of the sense resistor at a reference temperature. So initially the derived Rs will be inaccurate.

The derived Is is applied to the function block 32, which estimates the power P dissipated by the resistor 14 using the equation P=Is*Vs. Power dissipated by the resistor 14 is associated with a certain increase in heat of the resistor 14 and, typically, an increase in the resistance Rs of the resistor 14. As previously mentioned, the power P may be derived using the calculated average values of Vs and Is over a certain time period relating to the thermal mass of the sense resistor, since the resistor takes time to heat up and cool. The instantaneous current Is will still be determined by the instantaneous measurement of Vs and the equation Is=Vs/Rs.

The derived power P is applied to the function block 34, which estimates the actual temperature Tr of the resistor 14 using the equation: $Tr=Ts+\theta P(1-e^{-t/\tau})$.

The derived actual temperature Tr is applied to the function block 36, which estimates the actual resistance Rs of the resistor 14 using the equation: $Rs=Ro(1+\alpha(Tr-Tref))$. The resistance Ro is a previously measured resistance of the resistor 14 at a reference temperature Tref, typically the presumed ambient temperature surrounding the resistor 14 without any power being dissipated by the resistor 14. Ro is sometimes specified by the manufacturer of the component. Tref is typically the nominal room temperature of 25° C.

The derived estimated actual resistance Rs is applied to the function block 30 to update the derived current Is. If Vs does not rapidly change, a steady state Rs will be derived after a few iterations.

In some applications, the average current is continually changing, such as in a switching power supply powering a changing load. Accordingly, it may be desirable that the update rate of the logic in the block 22 (FIG. 1) be relatively fast so that the increasing and decreasing power dissipated by the resistor 14 is used in the equations shown in FIG. 2 to continually update the actual resistance of the resistor 14 to provide an accurate current Is signal.

The constants in the various equations may be specified by a datasheet supplied by the manufacturer or measured. Once the current sensing circuit is fabricated, the circuit needs to be calibrated to derive certain values used in the equations presented above.

For calibration, all parameters can be found by measuring Vs and Ts with a known current load, Is, under steady state conditions. The following equation can be used in a least-square fit to find the critical steady state calibration parameters:

$$Rs=Ro(1+\alpha(Ts-Tref+\theta VsIs)),$$

where $\theta VsIs$ represents the temperature error between the actual temperature of the resistor and the sensed temperature Ts.

If $\alpha$ is known prior to calibration, and Ts and Vs are measured, a simple two current load measurement at a single temperature can be used to estimate $\theta$ and Ro. The two known currents (Is1 and Is2) may be supplied by an external current source, and the calibration current can be measured by a conventional current measuring device directly connected to the circuit. Note that, in the case of the resistor 14 being an inductor winding, a for copper is well known, and Ro at a Tref is often reported by the inductor's manufacturer. Once the steady state parameters have been calibrated, residual transient errors in measured current can be used to calculate the remaining time dependant parameter t (thermal time constant of the medium).

As seen, some benefits of the invention include: 1) heat flow induced errors due to physical placement of the temperature sensor away from the current sense resistor are accounted for in the calibration and operation of the current sensing circuit of FIGS. 1 and 2, resulting in superior current measurement accuracy; 2) both steady state and transient errors arising from dynamic heat flow between the temperature sensor and current sense resistor are accounted for; and 3) the proposed calibration method is very flexible, allowing either accurate characterization of all parameters under only a few temperature and load current conditions, or, if temperature drift is already known, the heat transfer parameters and initial resistance can be obtained with a single (room) temperature measurement.

Only a few simple calibration coefficients are used in the correction method to calculate the sense resistance. This is superior to employing large tables of calibration data requiring table lookup of the sense resistance during operation.

Although the preferred embodiment uses an analog-to-digital converter and a digital logic implementation, the correction can be realized in discrete time, pure analog, or mixed signal implementations. The parameters used to tune the algorithm for an inductor sense resistor on a PC board can be easily obtained from a simple two-current measurement at room temperature and information about the temperature drift of the inductor material. Alternatively, calibration measurements over a wide range of temperatures and load currents can be used obtain the needed parameters without prior knowledge of the sense element material.

If increased current accuracy is desired, transient effects can be taken into account if the current through the sense resistor 14 is expected to vary. When the load current is stepped instantaneously, the previously described equations apply the full power and assume a sense resistor temperature rise equal to its final value, when in fact the resistor temperature rises to the final value over time with its own characteristic time constant. During this transition, the difference between the calculated "actual" resistor temperature Tr and the true actual one creates additional transient error. The problem becomes significant in cases where the load changes rapidly, and the resistor temperature does not settle. The following section describes a simple digital iterative algorithm that solves this transient problem, while keeping the same steady state accuracy.

The differential equation describing the temperature change in the resistor (assumed to be an inductor winding in a switching power supply) is $$\frac{\partial T_{ts}}{\partial t} = \mu(P_{in} - P_{out}) \qquad \text{(eq. 3)}$$

Here $P_{in}V_{dcr}I_{out}$ is the heat dissipation in the inductor (where Vdcr is the average voltage over a discrete time interval), $P_{out}=hT_{is}=h(T_i-T_s)$ is the heat lost due to conductive cooling, and p and h are proportionality constants. These two constants can be found from the steady state solution and the case describing cooling with characteristic thermal time constant τ.

$$\frac{\partial T_{is}}{\partial t} = 0, \ T_{is} = \theta_{is} V_{dcr} I_{out} \quad \text{(eq. 4)}$$

$$P_{in} = 0, \ \frac{\partial T_{is}}{\partial t} = \frac{-1}{\tau} T_{is} \quad \text{(eq. 5)}$$

Substituting the thermal resistance $\theta_{is}$ and the thermal time constant τ, transforms eq. 3.

$$\frac{\partial T_{is}}{\partial t} = \frac{\theta_{is}}{\tau} V_{dcr} I_{out} - \frac{1}{\tau} T_{is} \quad \text{(eq. 6)}$$

Estimating the derivative using forward Euler approximation with sampling time $t_s$ and substituting in eq. 6 yields $$\frac{T_{is}(k) - T_{is}(k-1)}{t_s} = \frac{\theta_{is}}{\tau} V_{dcr}(k-1) I_{out}(k-1) - \frac{1}{\tau} T_{is}(k-1) \quad \text{(eq. 7)}$$

The equation can be simplified further to show the digital implementation explicitly $$T_{is}(k) = \left(\theta_{is}\frac{t_s}{\tau}\right) V_{dcr}(k-1) I_{out}(k-1) + \left(1 - \frac{t_s}{\tau}\right) T_{is}(k-1) \quad \text{(eq. 8)}$$

The only additional state (e.g., from a register or SRAM location) needed is the estimate of the difference between the inductor temperature and the measured temperature, $T_{is}(h)$, which is updated every time the current, voltage drop, and inductor sensed temperature change. The new $I_{out}$ value is then calculated as follows $$I_{out}(k) = \frac{V_{dcr}(k)}{R_o(1 + \alpha(T_s(k) + T_{is}(k) - T_{ref}))} \quad \text{(eq. 9)}$$

The initial conditions for the iterative algorithm can be $$T_{is}(0) = \frac{1}{2} \frac{\theta V_{dcr}^2(0)}{R_o(1 + \alpha(T_s(0) - T_{ref}))} \quad \text{(eq. 10)}$$

$$I_{out}(0) = \frac{V_{dcr}(0)}{R_o(1 + \alpha(T_s(0) + T_{is}(0) - T_{ref}))} \quad \text{(eq. 11)}$$

The initial temperature rise in the inductor is assumed to be only half of the steady state value. This selection is not very critical, since the algorithm will converge to the exact value within a couple of inductor time constants. In order to simplify the digital implementation $T_{is}(0)=0$ can be used as well. The current is then calculated using the same subroutine as during the normal operation to calculate current.

Figure 3:
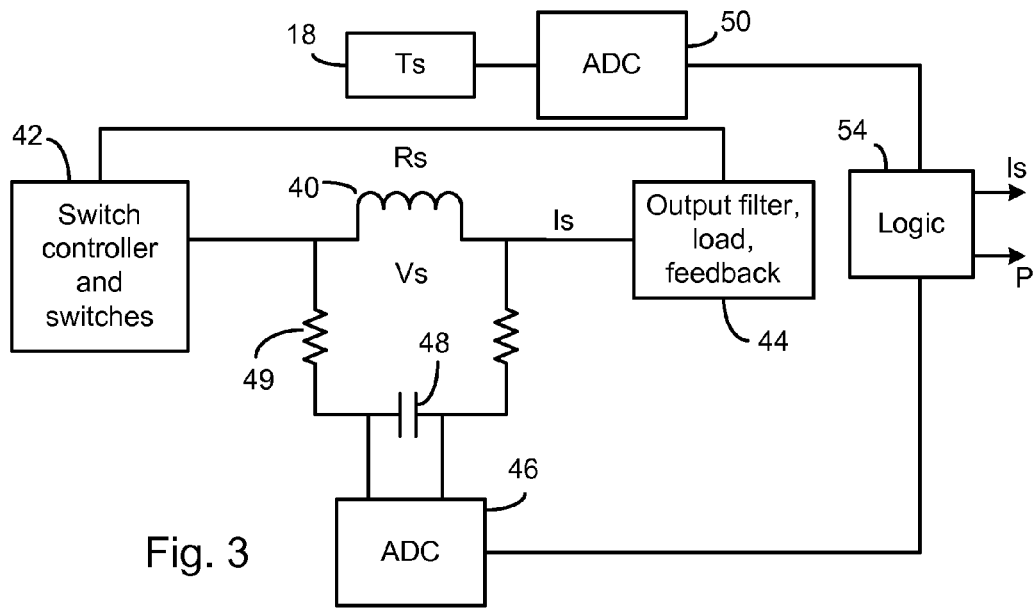
FIG. 3 illustrates a switching power supply having an inductor as part of an output filter, where the inductor winding is used as a sense resistor, and also illustrates the current sensing circuit in accordance with one embodiment of the invention.

FIG. 3 illustrates a DC-DC switching power supply having an inductor 40 as part of an output filter, where the inductor winding is used as a sense resistor. FIG. 3 also illustrates a portion of the current sensing circuit in accordance with one embodiment of the invention. The switch controller/switches block 42 creates a duty cycle of alternating connections between ground and a supply voltage. The duty cycle determines the DC output voltage at the load. The switches are normally transistors or a transistor and a diode. The current ramps up and down through the inductor 40 at the switching frequency. The block 44 includes the remainder of the power supply and may include an output filter capacitor, rectifier, load, and feedback circuitry. An analog-to-digital converter (ADC) 46 receives the ramping voltage across the inductor 40. The capacitor 48 and resistors 49 form a low pass anti-aliasing filter for the ADC 46 and attenuate high frequency disturbances. Another ADC 50 receives the temperature signal from the temperature sensor 18. The temperature sensor 18 will typically share the same PCB with the inductor 40, so the heat conducting medium is the PCB and any metal connections. A logic block 54 converts the digital signals to the levels and ranges needed for accurate conveyance of the voltage and temperature. The logic block 44 performs the various calculations described above to derive the current Is through the inductor 40 and the power P dissipated by the inductor 40 (used to determine the increase in temperature of the inductor 40 above Tref).

Figure 4:
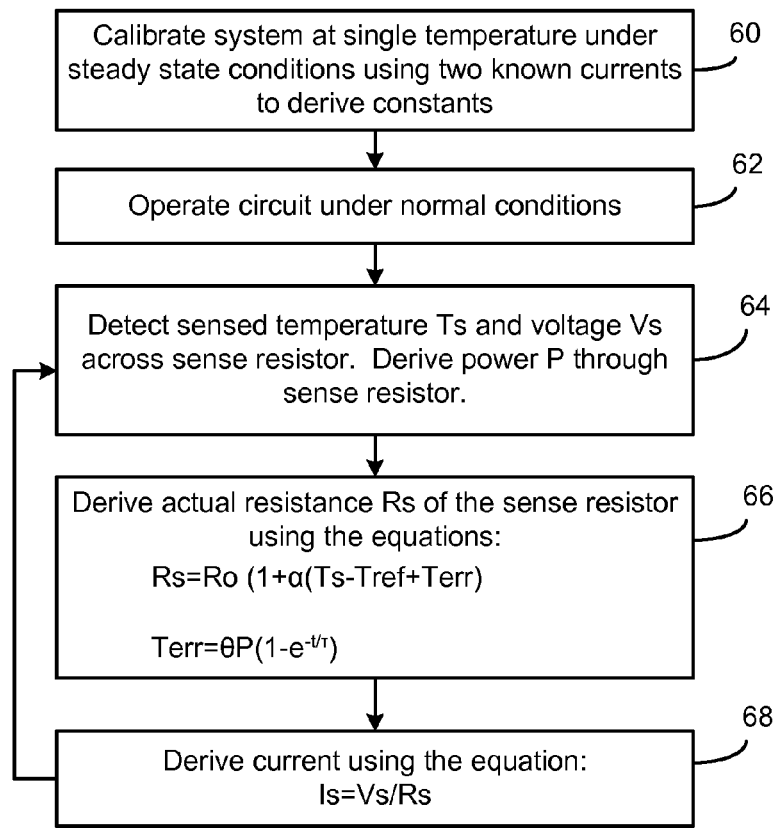
FIG. 4 is a flowchart identifying various steps used to derive the current through a sense resistor in accordance with one embodiment of the invention.

FIG. 4 is a flowchart identifying various steps used to derive the current through a sense resistor in accordance with one embodiment of the invention.

In step 60, the system is calibrated to derive the various constants. In a simple embodiment of a calibration method, the constants for the various equations identified above are determined by operating the current sensing circuit at a single known temperature under steady state conditions using two known currents. Certain constants, such as values at a reference temperature, may be supplied by the manufacturer of the component so do not need to be measured.

In step 62, the circuit (e.g., a power supply) employing the current sensing circuit is operated normally.

In step 64, to accurately determine the current through the sense resistor by deriving the actual resistance at an increased temperature of the resistor (due to power being dissipated by the resistor), the measured temperature Ts by a temperature sensor and a measured voltage Vs across the resistor (and average voltage Vs if applicable) are applied to the various equations.

In step 66, the actual resistance Rs of the sense resistor is estimated at the elevated temperature using the equations: Rs=Ro(1−α(Ts−Tref+Terr)) and Terr=θP(1−e<sup>−t/τ</sup>). Related equations may be used instead that derive the actual temperature of the resistor by estimating an instantaneous or average power P dissipated by the resistor, then derive the actual resistance Rs using the derived actual temperature. Even a poor estimate of the increase in resistor temperature due to increased power will provide an improvement over prior art methods of sensing current.

In step 68, the actual current Is is derived using the ohms law equation: Is=Vs/Rs. The process is iterative to continually improve accuracy and update the current. In the iterative process used in one embodiment of the invention, the initial estimate of the resistance used to calculate the current can be Rs=Ro(1+α(Ts−Tref)).

In one embodiment, the increase in sense resistor resistance by an increased power can be estimated by the measured Vs without using the temperature sensor signal. In one embodiment, no temperature sensor is even needed to carry out the invention. The sense element environment temperature may be inferred using the sense element itself by measuring Vs before and after self heating effects have taken place.

It is also possible to use the iterative equation 8, describing the self-heating, without a temperature sensor. One example is a slow self-calibration circuit that measures the resistance of the sense element at the current temperature, and then applies the additional self-heating correction to increase the accuracy during fast transients:

$$R_i = R_1(1 + \alpha\theta_{is} V_{dcr} I_{out})$$

Here, $R_1$ is the resistance of the sense element at the current temperature. Note that exact knowledge of that temperature is not needed, since the auto-calibration measures directly the final result:

$$R_1 = R_0(1 + \alpha(T_s - T_{ref}))$$

Significant improvement in measurement accuracy can be made with even inaccurate estimates of power with low thermal resistance between current and temperature sense elements. We found that the following estimates for sense resistance provided significant current measurement accuracy improvements in laboratory trials compared to no estimation of the temperature error term:

$$Rs = R_O(1 + \alpha(Ts - Tref + \theta Vs Is))$$

$$\hat{Rs} = R_O\left(1 + \alpha\left(Ts - Tref + \frac{\theta Vs^2}{Ro(1 + \alpha(Ts - Tref))}\right)\right)$$

$$\hat{Rs} = R_O\left(1 + \alpha\left(Ts - Tref + \frac{\theta Vs^2}{Ro}\right)\right)$$

The preferred embodiment of the present innovation corrects for the transient and steady state temperature measurement errors due to physical separation between a resistive sense element and the temperature sensor. Accurate current measurements may result from discrete time $V_{dor}$ and $T_s$ readings and a compensation method. Although, in one embodiment of this invention, we refer to the problem of measuring current using intrinsic inductor resistance as a current sense element, the invention can be used in any current sense application where temperature gradients exist between a resistive current sense element and a temperature sensor.

One other example application is the problem of correcting for copper lead frame resistance given an integrated temperature sensor. Since a temperature gradient between the integrated resistor and die silicon exists, temperature measurement errors result. This invention corrects for such thermodynamic errors using a very simple iterative algorithm specifically designed for fast, low overhead algorithmic implementation.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit comprising:
   a power source for generating current;
   a resistive sense element connected to conduct the current, the resistive sense element having a temperature coefficient of resistance;
   a temperature sensor, not in physical contact with the resistive sense element, positioned to detect a temperature of an environment of the resistive sense element;
   a voltage detector connected to detect a voltage across the resistive sense element; and
   processing circuitry connected to receive a first signal corresponding to the voltage across the resistive sense element and connected to receive a second signal corresponding to the temperature detected by the temperature sensor,
   wherein the processing circuitry is configured to derive a third signal related to a power dissipated by the resistive sense element based on at least the first signal, the third signal being related to an increased temperature of the resistive sense element,
   wherein the processing circuitry is configured to derive a resistance of the resistive sense resistor at the increased temperature based on the third signal and the temperature coefficient of resistance of the resistive sense element, to create a derived resistance,
   wherein the processing circuitry is configured to derive a current through the resistive sense element based on the derived resistance of the resistive sense element and a detected voltage across the resistive sense element, to create a derived current, and
   wherein the processing circuitry is configured to perform an iterative process to recalculate the third signal based on the derived resistance and the derived current to increase an accuracy of the derived current.

2. The circuit of claim 1 wherein the processing circuitry is configured to derive the third signal based on at least the first signal and the second signal.

3. The circuit of claim 1 wherein the processing circuitry performs an iterative process based on the derived current, the derived third signal, the derived resistance, and the first signal to increase an accuracy of the derived current.

4. The circuit of claim 1 wherein the third signal is related to an average or RMS power dissipated by the resistive sense element over a time interval.

5. The circuit of claim 1 wherein the third signal is related to an instantaneous power dissipated by the resistive sense element.

6. The circuit of claim 1 wherein the resistive sense element is an inductor winding.

7. The circuit of claim 1 wherein the resistive sense element and the temperature sensor are formed on a member that conducts heat between the resistive sense element and the temperature sensor.

8. The circuit of claim 1 wherein the resistive sense element has a positive thermal coefficient of resistance, wherein its resistance increases as power is dissipated by the resistive sense element.

9. The circuit of claim 1 wherein the processing circuitry is digital and wherein at least one analog-to-digital converter converts a signal from the temperature sensor and a signal from the voltage detector to digital signals for processing by the processing circuitry.

10. A circuit comprising:
    a power source for generating current;
    a resistive sense element connected to conduct the current, the resistive sense element having a temperature coefficient of resistance;
    a temperature sensor, not in contact with the resistive sense element, positioned to detect a temperature of an environment of the resistive sense element;
    a voltage detector connected to detect a voltage across the resistive sense element; and
    processing circuitry connected to receive a first signal corresponding to the voltage across the resistive sense element and connected to receive a second signal corresponding to the temperature detected by the temperature sensor, wherein the processing circuitry is configured to derive a third signal related to a power dissipated by the resistive sense element based on at least the first signal, the third signal being related to an increased temperature of the resistive sense element, wherein the processing circuitry is configured to derive a resistance of the resistive sense element at the increased temperature based on the third signal and the temperature coefficient of resistance of the resistive sense element, wherein the processing circuitry is configured to derive a current through the resistive sense element based on the derived resistance of the resistive sense element and a detected voltage across the resistive sense element, and wherein the processing circuitry carries out at least the following iterative process using the first signal and the second signal as inputs:

a. deriving I by calculating I=V/Rs, where I is a derived estimated current through the resistive sense element, V is the voltage across the resistive sense element, and Rs is a derived estimated resistance of the resistive sense element;

b. deriving P using at least the value I or V, where P is the power dissipated by the resistive sense element;

c. deriving Tr by calculating Tr=Ts+(P×Y), where Tr is a derived temperature of the resistive sense element, Ts is a temperature detected by the temperature sensor, and Y is a multiplication factor dependent on a thermal resistance $\theta$ of a medium that separates the resistive sense element and the temperature sensor;

d. deriving Rs by calculating Rs=Ro (1+$\alpha$(Tr−Tref)), where Ro equals the resistance of the resistive sense element at a known reference temperature Tref, and where $\alpha$ is the temperature coefficient of resistance of the resistive sense element; and e. repeating the calculations of steps a-d to improve an accuracy of the current I by improving an accuracy of the estimated derived resistance of the resistive sense element as the resistance of the resistive sense element varies due to the power dissipated by the resistive sense element.

11. The circuit of claim 1 wherein the processing circuitry comprises logic circuitry comprising at least one of firmware, a look-up table, and a microprocessor running a program.

12. The circuit of claim 10 wherein step c comprises deriving Tr by calculating Tr=Ts+$\theta$P(1−$e^{-t/\tau}$), where $\theta$ is the thermal resistance of the medium that separates the resistive sense element and the temperature sensor, where $\tau$ is the thermal time constant of the medium that separates the resistive sense element and the temperature sensor, and t is the elapsed time between an increase in heat generated by the resistive sense element and a measurement of temperature by the temperature sensor.

13. The circuit of claim 10 wherein power P is an average or RMS power.

14. The circuit of claim 10 wherein the processing circuitry comprises logic circuitry comprising at least one of firmware, a look-up table, and a microprocessor running a program.

* * * * *